United States Patent [19]

Meyer

[11] Patent Number: 4,983,574

[45] Date of Patent: Jan. 8, 1991

[54] COMPOSITE SUPERCONDUCTOR

[75] Inventor: Gundolf Meyer, Birmenstorf, Switzerland

[73] Assignee: BBC Brown Boveri AG, Baden, Switzerland

[21] Appl. No.: 221,519

[22] Filed: Jul. 20, 1988

[30] Foreign Application Priority Data

Jul. 28, 1987 [CH] Switzerland .......... 2881/87

[51] Int. Cl.$^5$ ............ H01B 12/00
[52] U.S. Cl. .......... 505/1; 505/704; 505/805; 505/807; 505/813; 505/823; 505/740; 75/234; 75/235; 29/599; 174/125.1; 72/273; 264/61; 264/125; 428/378; 428/471
[58] Field of Search .......... 75/234, 235; 428/378, 428/471; 505/805, 807, 813, 1, 704, 740, 823; 29/599; 174/125.1; 72/273; 264/61, 125

[56] References Cited

U.S. PATENT DOCUMENTS

| | | | |
|---|---|---|---|
| 4,762,754 | 8/1988 | Nellis et al. | 428/552 |
| 4,826,808 | 5/1989 | Yurek et al. | 505/1 |
| 4,892,861 | 1/1990 | Ray | 505/1 |

FOREIGN PATENT DOCUMENTS 3531770 3/1987 Fed. Rep. of Germany.

OTHER PUBLICATIONS

Ba-Y-Cu-O Superconducting Tape prepared by Surface Difusion, Jap. Journal Physics, vol. 26, No. 7, 7/87.
High $T_c$ Superconductors–composite wire fabrication, S. Jin, R. C. Sherwood, R. B. van Dover, T. H. Tiefel, and D. W. Johnson, Jr.
Toshiba Corporation, R± D Center, Yoshino et al., "Superconducting Wire and Coil with Zero Resistance State at 90 K and Current Density of 510 A/cm$^2$ at 77 K".
Advanced Ceramic Materials, Ceramic Superconductors, vol. 2, No. 3B, Jul. 1987, Special Supplementary Issue, pp. 388–400.
Japanese Journal of Applied Physics, vol. 26, No. 5, May 1987, pp. 2736–2737.
Yamada et al., "Critical Current Density of Wire Type Y—Ba—Cu—Oxide Superconductor".
Kawai et al., "Preparation of High-$T_c$Y—Ba—Cu—O Superconductor".
Japanese Journal of Applied Physics, vol. 26, No. 5, May 1987, pp. 2865–2866.

Primary Examiner—Stephen J. Lechert, Jr.
Assistant Examiner—Nina Bhat
Attorney, Agent, or Firm—Oblon, Spivak, McClelland, Maier & Neustadt

[57] ABSTRACT

Conductor in strip, sheet or wire form with an electrical conductivity of at least $0.85 \times 10^6 \, \Omega^{-1} \, cm^{-1}$ at 77° K. composed of a composite material of a metal matrix (1) and particles (2) composed of a high-temperature superconductor of the type RE Ba$_2$Cu$_3$O$_{6.5-7.5}$ embedded therein and arranged rectilinearly in the longitudinal direction, RE generally denoting a rare earth metal. Preferably RE=yttrium and specifically the substance YBa$_2$Cu$_3$O$_7$ and the particle diameter=0.1–100 μm, more narrowly 0.2–20 μm. Optionally an additional metal sheath which envelops the body forming the matrix (1).

6 Claims, 2 Drawing Sheets

COMPOSITE SUPERCONDUCTOR

BACKGROUND OF THE INVENTION

1. Field of the Invention

Technology of electrical superconductors. Recently materials which have superconducting properties have been acquiring increasing importance. The discovery of new superconductor materials, in particular of the rare earths/Ba/Cu/O type led to an appreciable extension of the possible applications for superconductors since these substances become superconducting even at temperatures above 50 K.

The invention relates to the further development and improvement of components which contain a ceramic high-temperature superconductor in strip or wire form, it being intended to take the requirements of industrial large scale production into account.

In particular it relates to a conductor with an electrical conductivity of at least $0.85 \times 10^6 \, \Omega^{-1} \, cm^{-1}$ at 77 K composed of a composite material which is in turn composed of a conventionally conducting metallic part and a superconducting part.

2. Discussion of Background

Among the electrical conductors which exist as solids and are based on electron migration, two groups can essentially be distinguished: 1. the usual metallic conductors, such as copper, silver, aluminum etc. and their alloys, 2. the superconductors and, among them, specifically the ceramic sintered high-temperature superconductors based on oxides of the rare earth metals, of barium and of copper. The latter are very brittle and can, consequently, no longer be subjected to further shaping processes as a finished chemical compound. Their technology has been described in various publications (cf. for example, T. Kawai and M. Kanai, "Preparation of high-Tc Y—Ba—Cu—O Superconductor", Jap. Jour. of Applied Physics, Vol. 26, No. 5, May 1987, pages 2736-2737; Y. Yamada, N. Fukuschima, S. Nakayama and S. Murase, "Critical current density of wire type Y—Ba—Cu—Oxide superconductor", Jap. Jour of Applied Physics, Vol. 26, No. 5, May 1987, pages 2865-2866; H. Yoshino, N. Fukushima, M. Niu, S. Nakayama, Y. Amada and S. Murase, "Superconducting wire and coil with zero resistance state at 90 K and current density of 510 A/cm² at 77 K", Toshiba Corporation, R + D Center, Saiwai-Ku, Kawasaki-City 210, Japan).

The unworkability of these compact high-temperature superconductor materials which exist as sintered bodies raises the question of new processing technologies, in particular in relation to an industrial manufacture of bodies in strip, sheet and wire form. There is a considerable need to extend the possible applications of such superconductors since they become superconducting even above 77 K (boiling point of nitrogen) and a complicated multistage refrigeration system using helium as the carrier medium becomes unnecessary.

SUMMARY OF THE INVENTION

Accordingly, one object of this invention is to provide a conductor with an electrical conductivity of at least $0.85 \times 10^6 \, \Omega^{-1} \, cm^{-1}$ which can be produced in a simple manner and can be processed to give any desired form, in particular strip, sheet and wire form. The conductor should be at least partially superconducting at the boiling point of nitrogen (77 K).

This object is achieved in the conductor mentioned in the introduction, wherein particles of a ceramic sintered high-temperature superconductor of the type $(RE)Ba_2Cu_3O_{6.5-7.5}$, where RE = rare earth metal, are embedded in a matrix composed of a conventionally conducting metallic part.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein

FIG. 1 shows the diagrammatic longitudinal section through a wire-type electrical conductor. The composite material is composed of a metal matrix 1 in which particles 2, arranged rectilinearly in the longitudinal direction, composed of a high-temperature superconductor are embedded. Preferably, superconductors of the type $(RE)Ba_2Cu_3O_{6.5-7.5}$, where RE = rare earth metal, in particular yttrium, are used for this purpose. The mean particle diameter is 0.1–100 μm, preferably 0.2–20 μm in the finished conductor.

FIG. 2 shows the diagrammatic cross-section through a wire-type conductor according to FIG. 1. The reference symbols are the same.

FIG. 3 shows the diagrammatic longitudinal section through a wire-type conductor with a sheath. Particles 2 are embedded in the matrix 1. The whole inserts in a sheath 3 composed of metal, preferably composed of copper or silver.

FIG. 4 shows the diagrammatic cross-section through a wire-type conductor with sheath according to FIG. 3. The reference symbols correspond to those in FIG. 3.

EXEMPLARY EMBODIMENT 1

Figure 1:
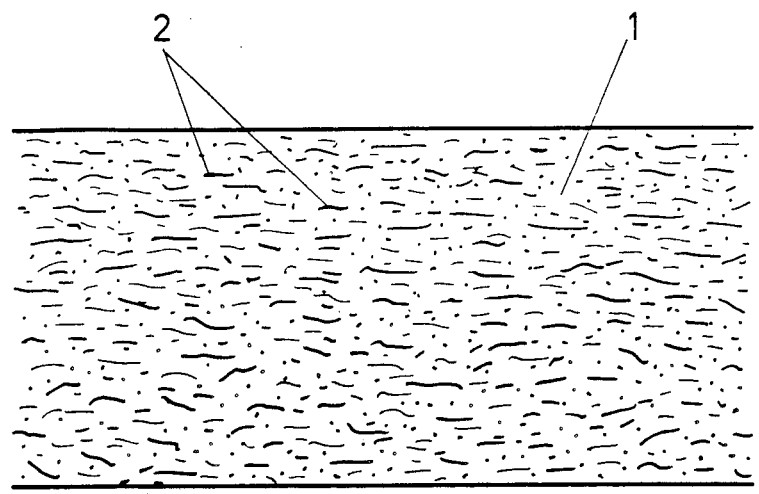
FIG. 1 shows the diagrammatic longitudinal section through a wire-type conductor.
Figure 2:
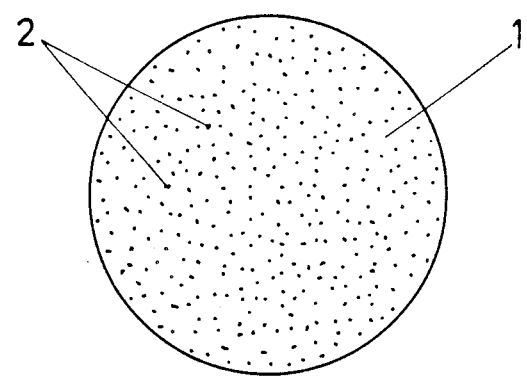
FIG. 2 shows the diagrammatic cross-section through a wire-type conductor.

See FIGS. 1 and 2

Approx. 100 g of a powder mixture was loaded into a cylindrical mold with a diameter of 12 mm and a length of 250 mm and rammed down tight. The powder mixture was composed of 50% by weight of copper powder having a mean particle size of 250 μm and 50% by weight of a superconducting ceramic powder of the composition $YBa_2Cu_3O_7$ having a mean particle size of 50 μm. The powder mixture was first compacted to a rod with a diameter of approx 10 mm by cold pressing. The precompacted rod was further compacted by hot isostatic pressing at a temperature of 300° C. for 3 h, and its diameter was still approx 8 mm. The rod was reduced in several passes by rotary swaging at a temperature of 250° C. to a diameter of 4 mm. An intermediate annealing was then carried out at a temperature of 350° C. for ½ h to reduce the internal stresses. Finally, the wire was drawn down cold in several passes to a final diameter of 1 mm.

The examination revealed a mean particle size of the superconducting particles 2 of approx. 20 μm, their arrangement in the metal matrix 1 (copper) being rectilinear. The electrical conductivity in the longitudinal direction at 77 K (temperature of boiling nitrogen) was approx. $1.5 \times 10^6 \Omega^{-1} \text{cm}^{-1}$.

EXEMPLARY EMBODIMENT 2

See FIGS. 1 and 2

Approx. 300 g of a powder mixture of 30% by weight copper powder (mean particle size 500 μm) and 70% by weight of superconducting powder $YBa_2Cu_3O_{7.2}$ (mean particle size 80 μm) were placed in the chamber of an extrusion press and rammed down tight. The chamber had a cylindrical shape (diameter 25 mm, length 150 mm). The orifice of the die was then sealed with a plug and hot compacting was carried out by means of die pressure at 300° C. for 10 min. After the plug had been removed from the die orifice, a wire having a diameter of 5 mm was extruded at a temperature of 350° C.: reduction ratio 25:1. The wire was then cold-drawn to a diameter of 0.8 mm.

The examination revealed a mean particle size of the particles 2 composed of superconducting substance of 15 μm. The texture of the superconducting particles in the metal matrix 1 was rectilinear. The electrical conductivity in the longitudinal direction at a temperature of 77 K was approx. $2.3 \times 10^6 \Omega^{-1} \text{cm}^{-1}$ and thus reached about 4 times the value of copper at room temperature.

EXEMPLARY EMBODIMENT 3

See FIGS. 1 and 2

240 g of silver powder (60% by weight) were mechanically alloyed with 160 g of superconductor powder (40% by weight) of the composition $YBa_2Cu_3O_{6.8}$ in a high-energy ball mill (Attritor). The mean particle size of the silver powder was 4 μm and that of the superconductor powder is 0.5 μm. The mechanically alloyed powder was loaded into a mold having a diameter of 18 mm and a length of 400 mm and rammed down tight. Then a precompacting was carried out in the cold state. The rod then had a diameter of 16 mm. Rotary swaging brought the rod down to a diameter of 6 mm in several passes. A stress-free annealing for ½ h at a temperature of 350° C. followed. Then the wire was drawn down cold to a diameter of 1.2 mm.

The mean particle size of the superconducting particles 2 was approx. 1 μm. It was possible to observe the typical rectilinear texture in the matrix 1 in a micrograph. The electrical conductivity was about $1.3 \times 10^6 \Omega^{-1} \text{cm}^{-1}$ at 77 K.

EXEMPLARY EMBODIMENT 4

Figure 3:
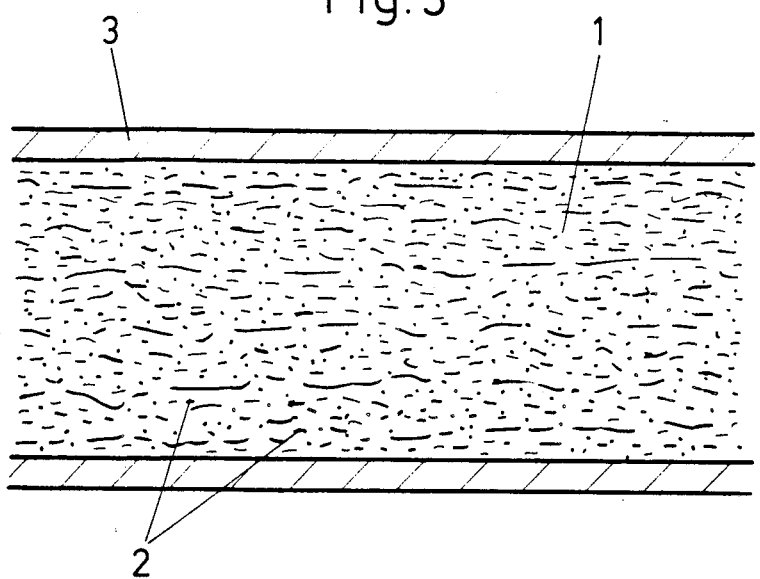
FIG. 3 shows the diagrammatic longitudinal section through a wire-type conductor with sheath.
Figure 4:
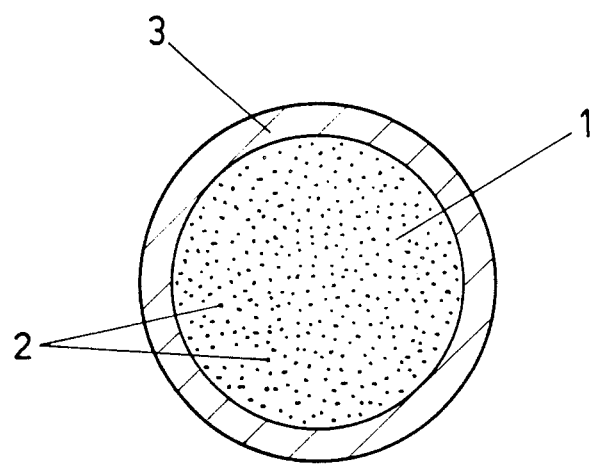
FIG. 4 shows the diagrammatic cross-section through a wire-type conductor with sheath.

See FIGS. 3 and 4

A sheath 3 composed of metal in the form of a copper tube with an outside diameter of 18 mm and an inside diameter of 16 mm was used. The tube was 300 mm long and had a holding capacity of approx. 60 cm³. Approx. 240 g in total of a powder mixture was loaded into the tube and rammed down tight. The powder mixture consisted of 60 g (25% by weight) of copper powder and 180 g (75% by weight) of a superconducting ceramic powder of the composition $YBa_2Cu_3O_7$, which had been metallized (copper-coated) beforehand. The mean particle size of the copper powder was 100 μm and that of the superconductor powder 20 μm. The sheath 3 was sealed at both ends under vacuum and the closed capsule produced in this manner containing the powder mixture was heated up to a temperature of 320° C. and placed in the chamber of an extrusion press. A sheathed wire having a diameter of 4 mm was produced by extrusion. Reduction ratio 20:1. Then the wire was drawn down to a diameter of 0.7 mm at a temperature of 200° C.

The examination revealed a mean particle size of the superconducting particles of 12 μm in a typical rectilinear arrangement. The electrical conductivity at 77 K was found to be approx. $2.5 \times 10^6 \Omega^{-1} \text{cm}^{-1}$.

EXEMPLARY EMBODIMENT 5

See FIGS. 3 and 4

A sheath 3 composed of metal in the form of a flat-sided rectangular tube composed of silver having the outside dimensions of 23 mm × 11 mm and the inside dimensions of 20 mm × 8 mm (length 500 mm) was filled with approx. 320 g of a powder mixture. The latter was composed of 200 g (62.5% by weight) of silver powder and 120 g (37.5% by weight) of superconductor powder of the formula $YBa_2Cu_3O_{6.7}$. The mean particle size of the silver powder was 50 μm and that of the superconductor powder 10 μm. The procedure was the same as in Example 4. After a closed vacuum-tight flat capsule had been produced, it was subjected to a rolling process at a temperature of 280° C. A flat rod having a thickness of 2.8 mm with a core having a thickness of 2 mm (wall thickness of the sheath 3: 0.4 mm) was first rolled. Said flat rod was further processed by cold drawing into a strip having a thickness of 0.4 mm (core: 0.3 mm; wall thickness of the sheath 3: 0.05 mm) and a width of 20 mm.

The particle size of the superconductor particles was on average approx. 5 μm. The particles had a flake shape and were arranged in rows. The electrical conductivity in the longitudinal direction was approx. $1.2 \times 10^6 \Omega^{-1} \text{cm}^{-1}$ at 77 K.

EXEMPLARY EMBODIMENT 6

A layer was deposited on a substrate in the form of a square copper sheet having a side length of 100 mm and a thickness of 1 mm in a cell by the electroplating/electrophoretic method from a bath containing copper in the electrolyte and superconductor particles in suspension. The suspension of the superconductor powder having the composition $YBa_2Cu_3O_7$ in the bath was adjusted so that a proportion of 30% by weight of superconductor particles was incorporated in the layer, while the electroplated deposit itself comprised the 70% by weight of copper.

The mean particle size of the superconductor particles in the deposited layer was 60 μm. After the porous layer had reached a thickness of approx. 10 mm, the plate formed in this manner was removed from the bath, washed, cleaned and dried. The thickness of the plate was reduced by cold pressing to a dimension of 7 mm and compacted to virtually theoretical density. By subsequent cold rolling, a strip was produced whose active layer had a thickness of 0.5 mm and the substrate had a thickness of 0.05 mm.

The particle size of the particles of superconducting substance was on average 25 μm. The particles had a flake form with their main surface arranged parallel to the plane of the sheet. The electrical conductivity in the longitudinal direction of the strip was approx. $1 \times 10^6 \Omega^{-1} \text{cm}^{-1}$ at 77 K.

The invention is not restricted to the exemplary embodiments. In principle, all metals and alloys which are good electrical conductors can be used as metal matrix 1 and as metal sheath 3. Copper and silver and their alloys are preferred. If need be, gold could also be suitable because of its corrosion and oxidation resistance, or aluminum because of its low density and relatively high strength. The sheath 3 advantageously has a thickness of 5 to 20% of the diameter of the body forming the matrix 1. Analogous ratios apply for other cross-sections (square, rectangular, hexagonal etc.). Suitable high-temperature superconductors for the embedded particles 2 are compounds of the type $(RE)Ba_2Cu_3O_{6.5-7.5}$, RE generally being a rare earth metal. The compound $YBa_2Cu_3O_7$ is preferred. The mean particle diameter is 0.1–100 μm, preferably 0.2–20 μm. The electrical conductor composed of the said composite material preferably has strip, sheet or wire form and has the maximum electrical conductivity (favored by rectilinear arrangement) in the longitudinal direction at 77 K. The working and, consequently, the development of the rectilinear structure may be limited to a marginal section, for example to a compacting and flattening operation on the surface.

WHAT IS CLAIMED AS NEW AND DESIRED TO BE SECURED BY LETTERS PATENT OF THE UNITED STATES IS:

1. A conductor with an electrical conductivity of at least $0.85 \times 10^6 \, \Omega^{-1} \, cm^{-1}$ at 77 K composed of a composite material which is in turn composed of a non-superconducting metallic part and a superconducting part, wherein particles (2) of a ceramic sintered high-temperature superconductor of the type $RE \, Ba_2Cu_3O_{6.5-7.5}$, were RE = rare earth metal, are embedded in a matrix (1) composed of the non-superconducting metallic part, wherein the particles (2) of the ceramic sintered high-temperature superconductor are arranged rectilinearly in the current direction, and wherein the matrix (1) is composed of copper or silver and the high-temperature superconductor of $YBa_2Cu_3O_{6.5-7.5}$ and the mean particle diameter of the latter measures 0.1–100 μm.

2. The conductor as claimed in claim 1, wherein it additionally has a sheath (3) of a pure metal or an alloy.

3. The conductor as claimed in claim 2, wherein the sheath (3) is composed of copper and has a thickness of 5 to 20% of the diameter of the body forming the matrix (1).

4. The conductor as claimed in one of claims 1, 2 and 3 wherein it has strip, sheet or wire form and has the maximum electrical conductivity in the longitudinal direction at 77 K.

5. A conductor as claimed in claim 1, wherein the particles (2) have a flake shape defining a main surface arranged parallel to a main axis of current flow.

6. The conductor as claimed in claim 1, wherein plural of the superconducting particles (2) have a needle form and are oriented parallel to a main axis of current flow.

* * * * *